United States Patent
Wang et al.

(10) Patent No.: US 9,551,923 B2
(45) Date of Patent: Jan. 24, 2017

(54) CUT MASK DESIGN LAYERS TO PROVIDE COMPACT CELL HEIGHT

(71) Applicant: Taiwan Semiconductor Manufacturing Co., Ltd., Hsin-Chu (TW)

(72) Inventors: Yen-Sen Wang, Hsinchu (TW); Ming-Yi Lin, Hsinchu (TW); Chen-Hung Lu, Hsinchu (TW); Jyh-Kang Ting, Baoshan Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 262 days.

(21) Appl. No.: 14/247,409

(22) Filed: Apr. 8, 2014

(65) Prior Publication Data
US 2015/0286765 A1 Oct. 8, 2015

(51) Int. Cl.
*G06F 17/50* (2006.01)
*G03F 1/00* (2012.01)

(52) U.S. Cl.
CPC .................................. *G03F 1/00* (2013.01)

(58) Field of Classification Search
CPC .............. H01L 2924/13062; H01L 2924/1306; H01L 2224/83; H01L 24/83; H01L 2225/06541; Y02P 70/521; G06F 17/5072
USPC ...................................................... 716/50–56
See application file for complete search history.

(56) References Cited

U.S. PATENT DOCUMENTS

| | | | |
|---|---|---|---|
| 2010/0011327 A1* | 1/2010 | Becker | H01L 27/0207 716/118 |
| 2010/0017767 A1* | 1/2010 | Becker | H01L 27/0207 716/118 |

* cited by examiner

*Primary Examiner* — Binh Tat
(74) *Attorney, Agent, or Firm* — Eschweiler & Associates, LLC

(57) ABSTRACT

Some embodiments relate to a method of designing an integrated circuit layout. In this method, a plurality of design shapes are provided on different design layers over an active area within a graphical representation of the layout. A connection extends perpendicularly between a first design shape formed on a first design layer and a second design shape formed on the first design layer. First and second cut mask shapes on first and second cut mask design layers, respectively, are generated. The first cut shape removes portions of the first design layer and the second cut shape removes portions of the second design layer.

19 Claims, 7 Drawing Sheets

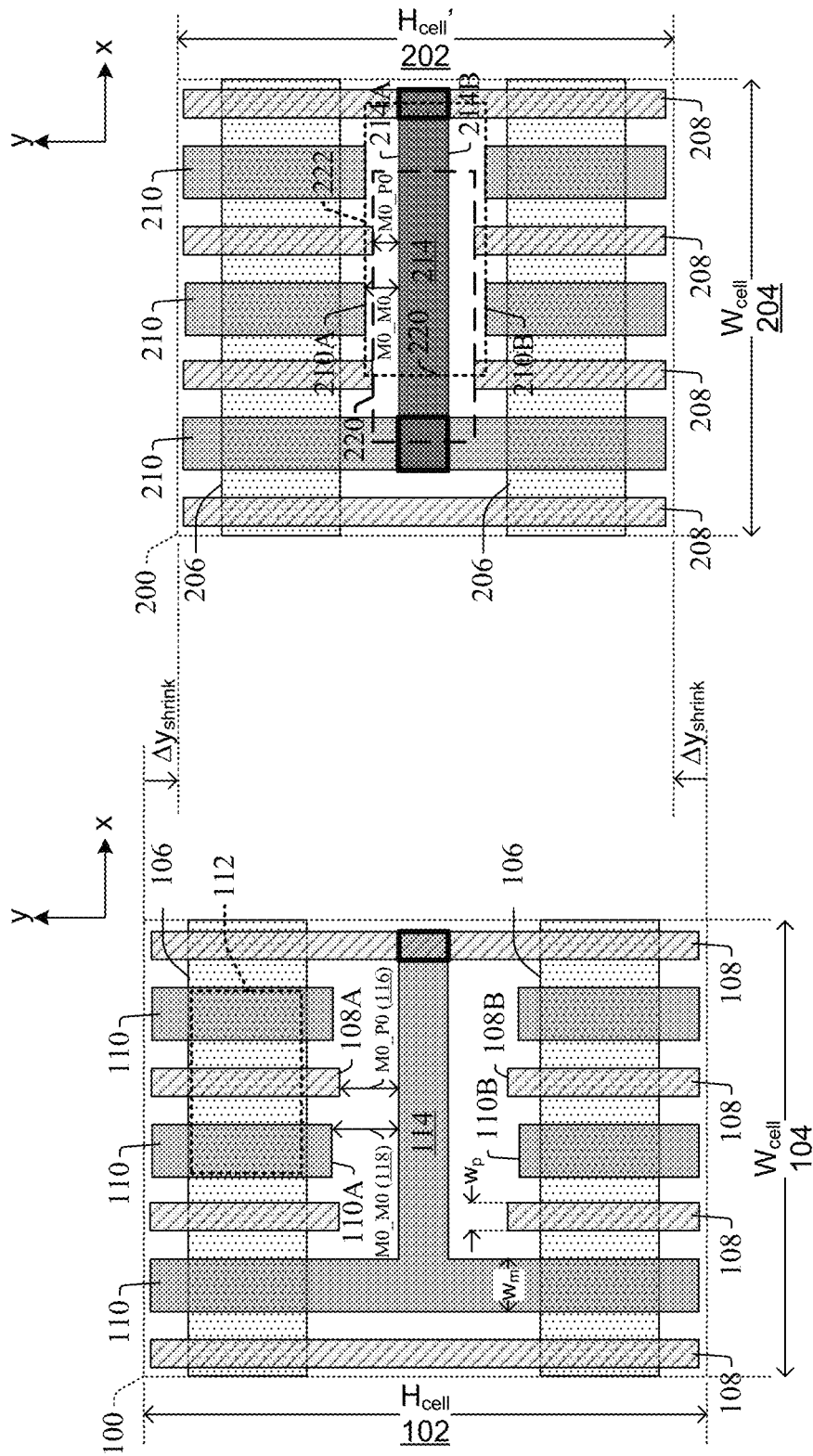

US 9,551,923 B2

CUT MASK DESIGN LAYERS TO PROVIDE COMPACT CELL HEIGHT

BACKGROUND

Modern integrated circuits (ICs) are enormously complicated. Some modern ICs have more than a billion transistors, which each have feature sizes on the order of 10 nm and which can each turn off and on at more than a billion times per second. Because of the complexity of modern IC design, as well as market pressure to rapidly churn out these designs, electronic design automation (EDA) tools are widely used in the IC design process. In short, these EDA tool are computer aided design tools that simulate the IC at various levels of abstraction under the direction of an IC designer. For example, the IC can be initially designed at a general functional level according to a functional design specification, and then can be later simulated and verified at a layout level to help make sure the final IC, as actually manufactured, will provide desired functionality.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 shows a top layout view of a standard cell, as viewed through a EDA design window.

FIG. 2 shows a top layout view of a standard cell with a reduced area in accordance with some embodiments, as viewed through an EDA design window.

DETAILED DESCRIPTION

Figure 3:
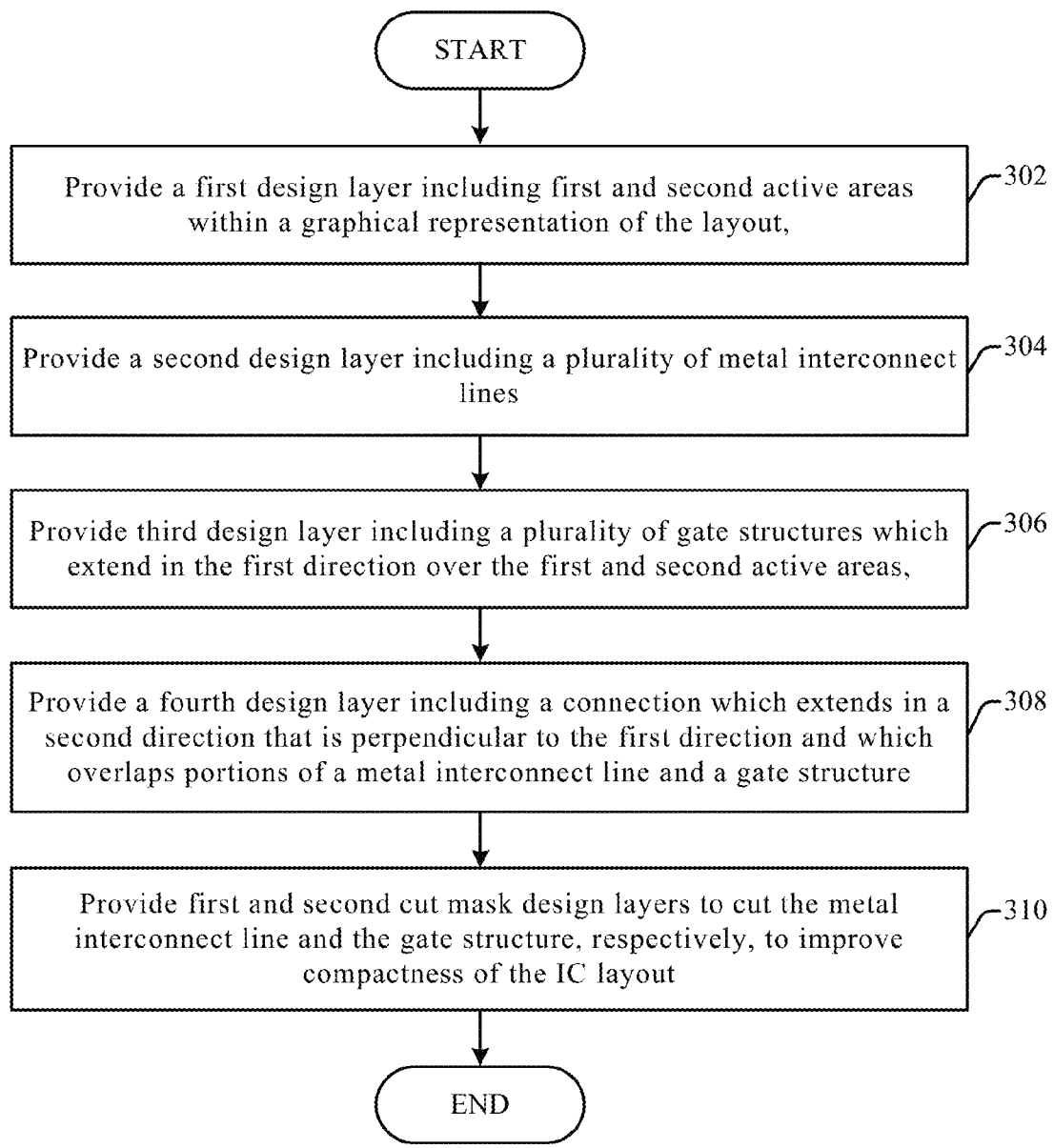
FIG. 3 shows a method in flowchart format of providing a layout in an EDA design window or through an EDA tool in accordance with some embodiments.

The following disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 illustrates an example of a standard cell layout 100 as viewed in an EDA design window, wherein the layout is made up of multiple layers which are formed and patterned one on top of one another. The standard cell layout 100 has a cell height, $H_{cell}$ (102), as measured in a first direction (e.g., y-direction), and has a cell width, $W_{cell}$ (104), as measured in a second direction (e.g., x-direction). Within this standard cell layout 100, active regions 106, which correspond to doped regions of a first doping type (e.g., n-type), are formed. Polysilicon lines 108, which have a poly line width, $w_p$, and metal lines 110, which have a metal line width, $w_m$ ($w_m > w_p$), overlie the active regions 106. Within this layout, transistor regions 112 can be formed by adding source/drain regions, which have a second doping type (e.g., p-type), on either side of polysilicon lines. Some standard cells can include multiple transistor regions, and IC designers generally attempt to minimize the area of each standard cell 100 in conformance with standard design rule checks.

The applicants have appreciated that perpendicular "jogs" or "turns" 114, which cross between neighboring polysilicon "line ends" 108A, 108B and neighboring metal "line ends" 110A, 110B, are one feature that can have a significant impact on the area of standard cell 100. In particular, due to patterning effects encountered at the extremely small scales of modern IC fabrication, the precise location of these "lines ends" (108A, 108B, 110A, 110B) is difficult to precisely control during manufacture—causing some manufactured poly or metal lines to be slightly longer than specified, others to be slightly shorter than specified, and others to be generally malformed. To account for this imprecise end line positioning, conventional design rule checks (DRCs) require each poly line end (e.g., 108A) to have some minimal spacing M0_P0 116 from edge of jog 114; and similarly requires each metal line end (e.g., 110A) to have some minimal spacing M0_M0 118 from edge of jog 114. Although these DRC rules help to avoid bridging, inadvertent shorts, and other undesired results between the jog 114 and poly and/or metal lines 108/110; these spacing rules 116, 118 also make a significant contribution to the overall cell height 102. As will be appreciated in more detail below, to reduce the cell height contributions arising from these line end spacing rules 116/118, the applicants have developed techniques that utilize a poly cut mask design layer and a separate metal cut mask design layer to "squeeze" the cell height 102 and provide more compact standard cell layouts than previously achievable.

FIG. 2 illustrates an example of a standard cell 200 in accordance with some embodiments. The standard cell 200 includes active areas 206 formed on a first design layer, gate lines 208 formed on a second design layer, metal lines 210 formed on a third design layer, and a connection 214 (e.g., "jog" or "turn" in the metal line) formed on a fourth design layer. A gate cut mask 220 and a separate metal cut mask 222 are used to "cut" the gatelines 208 and metal lines 210, respectively, to minimize cell area. Because the gate and metal cut masks 220, 222 are formed as separate design layers and are used as separate photolithography steps during manufacture, the end result is that the standard cell in FIG. 2 can have a cell height, $H_{cell'}$, which is reduced compared to other approaches. For instance, when comparing the examples in FIGS. 1-2, it can be seen that FIG. 2's standard cell 200, which is manufactured with separate gate and metal cut masks 220, 222, has a cell height, $H_{cell'}$ 202, which is reduced in height by $2*\Delta y_{shrink}$ compared to the other approach of FIG. 1 where cut masks were not used. In some embodiments, for example, the use of separate gate and metal cut masks can shrink the area of standard cells by approximately one percent in the y-direction and approximately 10 percent or less in the x-direction compared to conventional techniques. Therefore, the disclosed techniques can "squeeze" IC layout features tighter together, and thereby pack more functionality onto ICs for a given footprint size.

The gate lines 208, which are cut by a gate cut mask 220, can be implemented in a variety of ways. For example, in less cutting edge technology nodes, the gate lines 208 can often be implemented as polysilicon gate lines that are initially patterned and subsequently remain in place throughout the fabrication of the entire IC. In other embodiments, however, the gate lines 208 can be replacement gate structures, such as metal gates, which are formed when a corresponding sacrificial gate line is removed from the location of gate lines 208. This sacrificial gate line can be a polysilicon gate line or can be made of some other material. In general, the gate structure can be referred to as a G0 gate structure, although when the gate line is a polysilicon gate line, the second design layer can be referred to as a P0 layer. Similarly, the gate cut mask can be referred to more generally as a G0 cut mask, but can also be referred to as a P0 cut mask in cases where P0 polysilicon lines are being cut.

FIG. 3 illustrates a design methodology 300 in flow chart format in accordance with some embodiments. At 302, a first design layer is provided which includes first and second active areas, which are separated from one another by a spacing a first direction, within a graphical representation of the layout. At 304, a second design layer is provided which includes a plurality of gate structure lines, such as polysilicon gate lines or metal gate lines. At 306, a third design layer is provided which includes a plurality of metal lines that extend in the first direction over the first and second active areas. In 308, a fourth design layer is provided which includes a connection which couples first and second gate structure lines to one another, first and second metal lines to one another, or a gate structure line to a metal line. This connection extends in a second direction that is perpendicular to the first direction and overlaps portions of a metal line and a gate structure. In 310, first and second cut mask design layers are provided to improve the compactness of the IC layout. The first cut mask design layer is used to cut a gate structure line and to set an end of the cut gate structure line a first predetermined distance from a nearest edge of the connection, while the second cut mask design layer is used to cut the metal line and to set an end of the cut metal line a second predetermined distance from the nearest edge of the connection. As will be appreciated in more detail further herein, this methodology can "squeeze" IC layout features tighter together, and thereby pack more functionality onto unit size chips.

FIGS. 4-9, which are now described below, set forth a series of layout views that collectively illustrate design of a compact standard cell 400 by use of IC design techniques in accordance with some embodiments. These layout views are somewhat simplified depictions of what is seen through an electronic design automation (EDA) design window produced by an EDA tool, wherein the layouts are ultimately output to a standard file format, such as GDS, GDSII, GL1, OASIS, etc, used to manufacture masks that are in turn used to make actual wafers. While the method 300 of FIG. 3 and methodology illustrated in FIGS. 4-9 are described as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Figure 4:
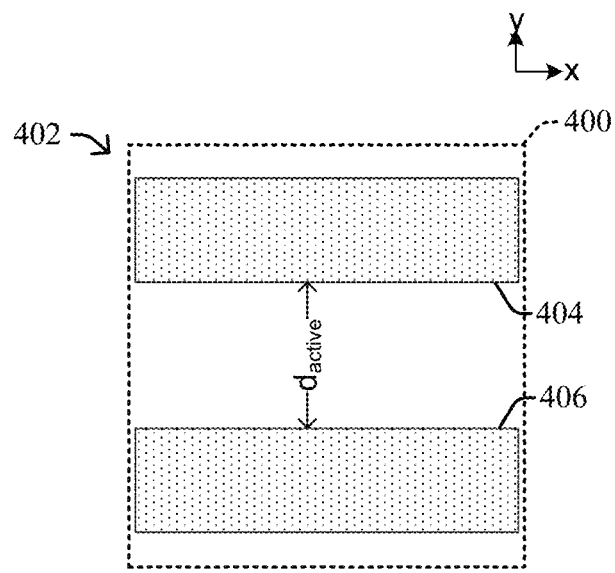
FIGS. 4-9B show a series of top layout views that highlight different layers used in an EDA tool to form an integrated circuit in accordance with some embodiments.

FIG. 4 shows an embodiment of a standard cell 400 with a first design layer 402 that includes first and second active areas 404, 406. The active areas 404, 406 are separated from one another in a first direction by a spacing, $d_{active}$. When these active areas are formed in a semiconductor substrate, they are typically formed by ion implantation or by out-diffusion of dopants from a deposited layer having a predetermined dopant type.

Figure 5:
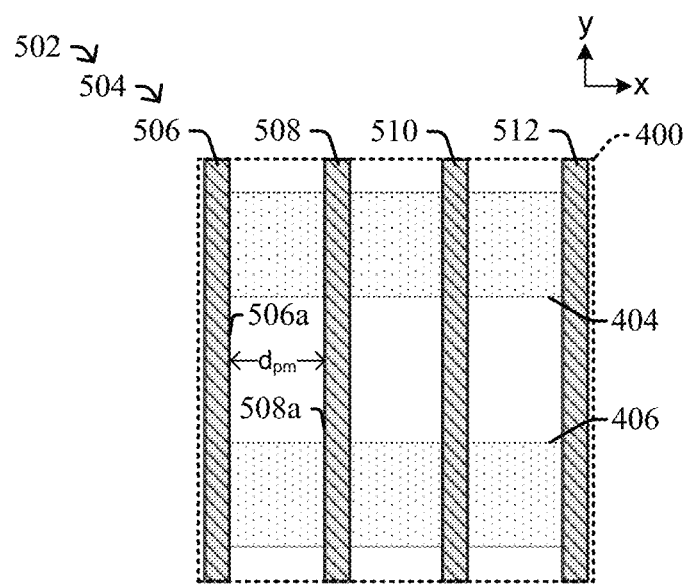

In FIG. 5, a second design layer 502, which includes gate structure lines 504, such as polysilicon_0 (P0) lines, has been added to the standard cell 400. The gate structure lines 504 can include a first P0 line 506, a second P0 line 508, a third P0 line 510, and a fourth P0 line 512 that extend in parallel to one another. In some embodiments, the P0 lines have neighboring edges (e.g., 506a, 508b) that are spaced at a minimum poly spacing, $d_{pm}$, resolvable by a photolithography process, such as a single patterning or double patterning process. The P0 lines can extend in parallel to one another in the first direction as illustrated, but can also include "jogs" or "turns" which are not illustrated.

Figure 6:
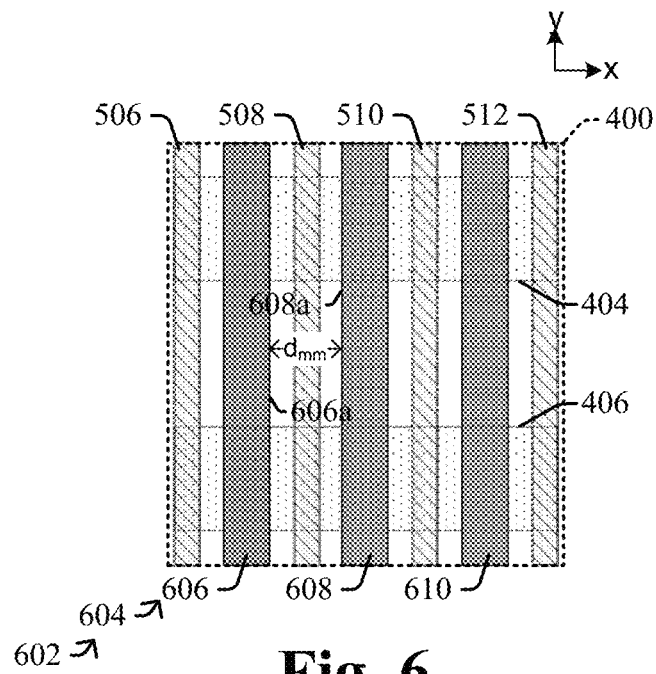

In FIG. 6, a third design layer 602, which includes metal lines 604, such as metal_0 (M0) lines, has been added to the standard cell 400. The metal lines 604 can include a first M0 line 606, a second M0 line 608, and a third M0 line 610 that extend in parallel to one another. In some embodiments, the M0 lines have neighboring edges (e.g., 606a, 608a) that are spaced at the minimum metal spacing, $d_{mm}$, resolvable by the photolithography process, such as a single patterning or double patterning process. The M0 lines can extend in parallel to one another in the first direction as illustrated, but can also include "jogs" or "turns" which are not illustrated. The metal lines 604 and gate structure lines 504 can be formed so the gate structure lines 504 are individually interspersed between neighboring metal lines 604.

Figure 7:
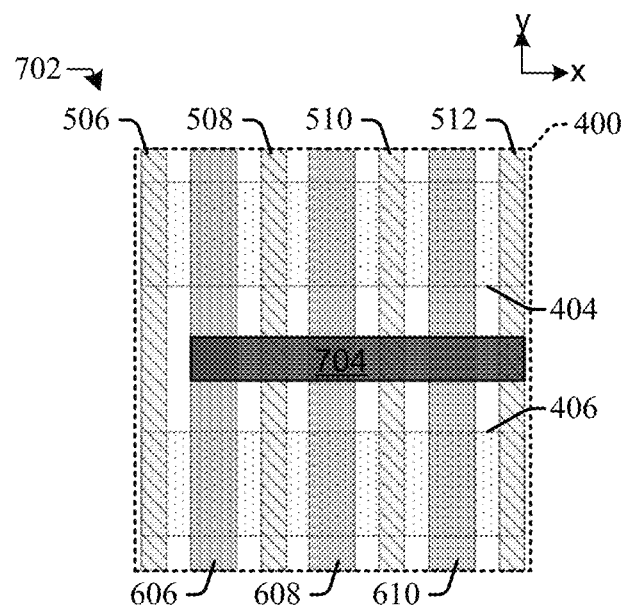

In FIG. 7, a fourth design layer 702 has been added to the standard cell. The fourth design layer includes a connection 704 that perpendicularly overlaps P0 lines 508, 512 and M0 lines 606, 608, 610. The connection 704 extends in a second direction that is perpendicular to the first direction. This connection 704 can, for example, be formed an M0 line that is formed separately from the M0 lines, or can be a higher level metal line, such as an M1 or M2 line, for example. For example, in the illustrated embodiment, the connection 704 operably couples the first M0 line 606 to the fourth P0 line 512.

Figure 8A:
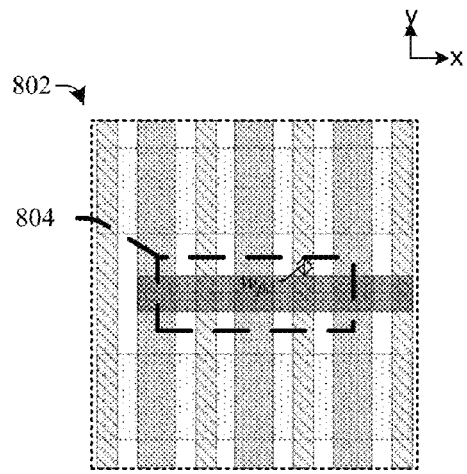
Figure 8B:
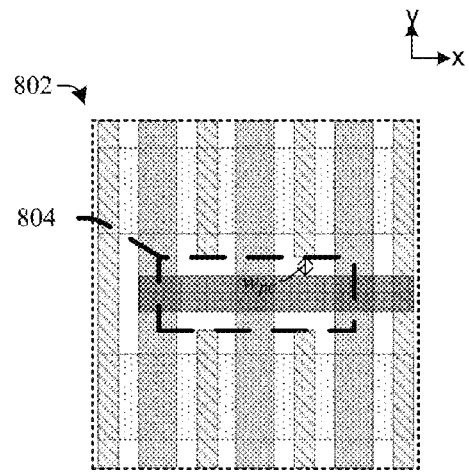

In FIG. 8A, a first cut mask design layer 802 is provided. The first cut mask design layer 802 includes a first cut shape 804, which can be symmetrical in the first direction about the connection 704. In the example wherein the first cut mask layer 802 is a P0 cut mask layer, the first cut mask shape 804 is a P0 cut mask shape in the form of a rectangle having a first pair of opposing edges (e.g., left and right edges) that are aligned on centerlines of respective M0 lines. The rectangle also includes a second pair of opposing edges (e.g., top and bottom edges) that are aligned on the poly line ends. As shown in FIG. 8B, the first cut shape 804 is configured to "cut" regions of the P0 lines 508, 510 which are circumscribed by the first cut shape 804. Thus, the first cut mask shape 804 sets a line end of a cut P0 line at a first predetermined cut distance, $w_{pc}$, from a nearest edge of the connection 704. The first predetermined cut distance, $w_{pc}$, is chosen based on the expected P0/M0 dielectric breakdown, and P0/M0 etching bias during process. For example, if the standard cell is going to be fabricated using a extremely high quality oxide and will be operated at low voltages in one case, the distance $w_{pc}$ can be smaller than in another case where the standard cell is going to be fabricated with a lower quality oxide and be operated at higher voltages, for example.

Figure 9A:
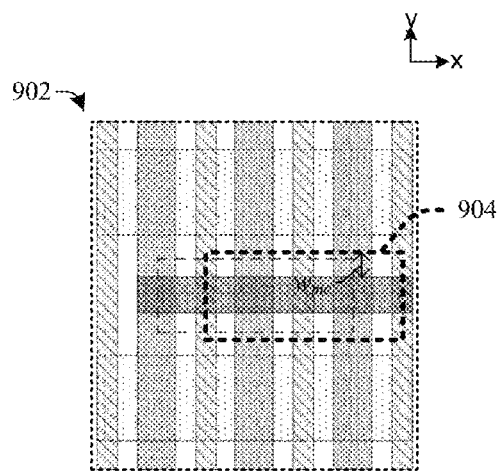
Figure 9B:
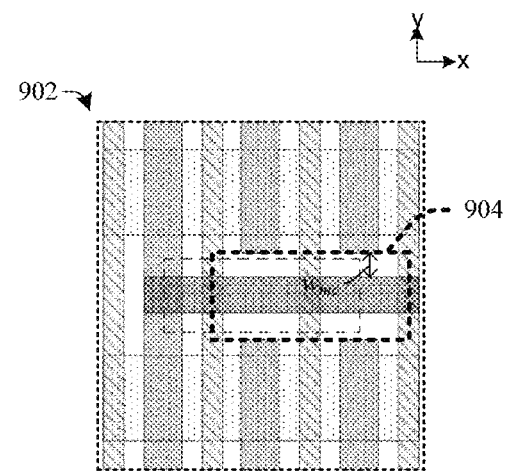

In FIG. 9A, a second cut mask design layer 902 is provided. The second cut mask design layer 902 includes a second cut shape 904, which can be symmetrical in the first direction about the connection 704. In the example wherein the second cut mask design layer 902 is a M0 cut mask layer, the second cut mask shape 904 is an M0 cut mask shape in the form of a rectangle having a first pair of opposing edges (e.g., left and right edges) that are aligned on centerlines of respective P0 lines. The rectangle also includes a second pair of opposing edges (e.g., top and bottom edges) that are aligned on the metal line ends. As shown in FIG. 9B, the second cut shape 904 is configured to "cut" portions of M0 lines which are circumscribed by the second cut shape 904. Thus, the second cut shape 904 sets a line end of a cut M0 line at a second predetermined distance, $w_{mc}$, from a nearest edge of the connection 704. The second predetermined distance, $w_{mc}$, can often be greater than the first predetermined distance, $w_{pc}$, although the first and second predetermined distances can also be equal in other embodiments. The second predetermined cut distance, $w_{mc}$, is chosen based on the expected P0/M0 dielectric breakdown, and P0/M0 etching bias during process. For example, if the standard cell is going to be fabricated using a extremely high quality oxide and will be operated at low voltages in one case, the distance $w_{pc}$ can be smaller than in another case where the standard cell is going to be fabricated with a lower quality oxide and be operated at higher voltages, for example.

Again, although some examples are described above with reference to a P0 polysilicon layer and P0 cut mask layer, it is to be appreciated that the present disclosure is not limited to polysilicon P0 gate layers or polysilicon P0 cut mask layers, but that other types of gates such as metal gates can also be used. Because the material of the gate structures can be different for different implementations, a more general nomenclature of a G0 gate structure (and corresponding G0 cut mask layer) is used to described these features in some embodiments.

Accordingly, the method illustrated in FIGS. 4-9 can be used to form a standard cell wherein the metal and poly ends are more closely spaced to perpendicular connection than previously achievable. It is noted that the use of both the first and second cut masks is advantageous, although not necessarily required, in that using only one of these cut masks will not shrink the size of the standard cell nearly as much as using both cut masks in conjunction with one another. For example, if only a P0 cut mask was used, although the polysilicon end lines could be pushed closer to nearest edges of the connection 214, the metal lines could still be spaced further away and would prevent significant shrinkage of the cell. The same is true if only one cut mask were used (e.g., if only a M0 cut mask and not a P0 cut mask were used). Therefore, use of both an M0 cut mask and a P0 cut mask in coordinated fashion provides significant advantages in shrinking the size of standard cells.

Further, although the discussion in this disclosure, such as the example previously shown in FIGS. 4-9, is focused primarily on the design methodology from the perspective of the EDA tool for convenience and clarity of understanding, it is to be appreciated that methods of manufacturing wafers using the layouts developed in this EDA tool are also contemplated as falling within the scope of this disclosure, as are integrated circuits manufactured by such techniques. For example, in some embodiments, poly and metal lines corresponding to poly lines 504 and metal lines 604 can be initially formed as continuous lines that cross over a region where connection 704 is to be formed; and these continuous poly and metal lines are then "cut" using cut masks corresponding to 802, 804 in anticipation of the connection 704 being formed in the cut openings. Thus, for example, after continuous poly lines are formed, a poly cut mask corresponding to 802 is used to cut the poly lines to set the poly line ends at a first predetermined spacing from nearest connection edges. Similarly, after continuous metal lines are formed, a metal cut mask corresponding to 902 is used to cut the metal lines to set metal line ends at a second predetermined spacing from nearest connection edges. In other embodiments, rather than actually forming continuous poly and metal lines, the cut masks 802, 902 can be used to block formation of the poly lines and metal lines in the respective areas circumscribed by the cut shapes on the poly cut mask and metal cut mask.

Figure 11:
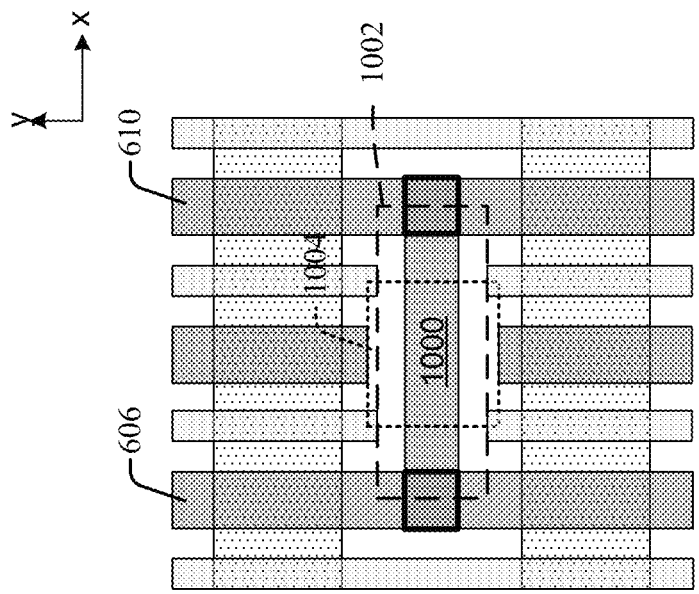
FIG. 11 shows an example of a top layout view wherein a connection operably couples a first M0 line to a second M0 line and after a cut mask have been to set M0 line ends a predetermined distance from nearest edges of connection in accordance with some embodiments.
Figure 10:
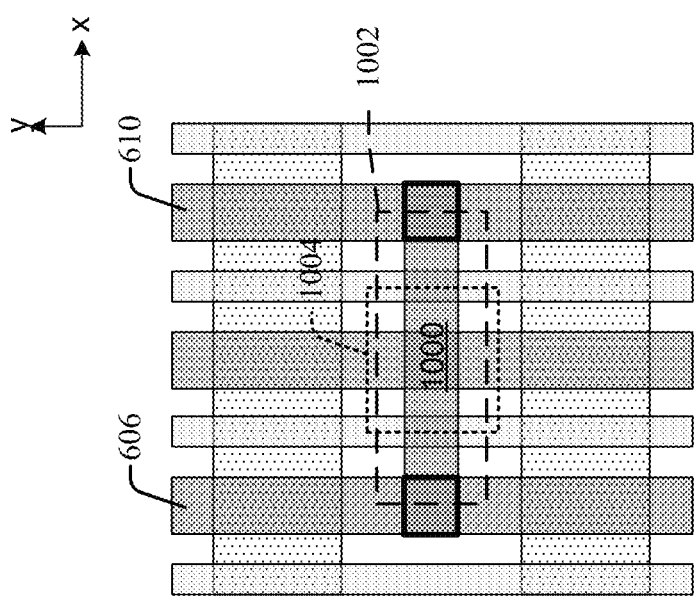
FIG. 10 shows an example of a top layout view wherein a connection operably couples a first M0 line to a second M0 line in accordance with some embodiments.

Although the embodiment of FIGS. 4-9 showed an example where connection 704 coupled M0 line 606 to P0 line 512, other connections are also possible. For example, FIGS. 10-11 show another example where connection 1000 couples a first M0 line 606 to a third M0 line 610. In particular, FIG. 10 shows P0 cut mask 1002 having P0 cut shape as well as M0 cut mask 1004 having M0 cut shape, both of which over lap metal lines and poly lines. FIG. 11 shows the structure after being formed, wherein the P0 cut mask 1002 removes or prevents formation of poly lines between poly line ends and connection 1000 and wherein the M0 cut mask 1004 removes or prevents formation of metal lines between metal line ends and connection 1000.

Figure 13:
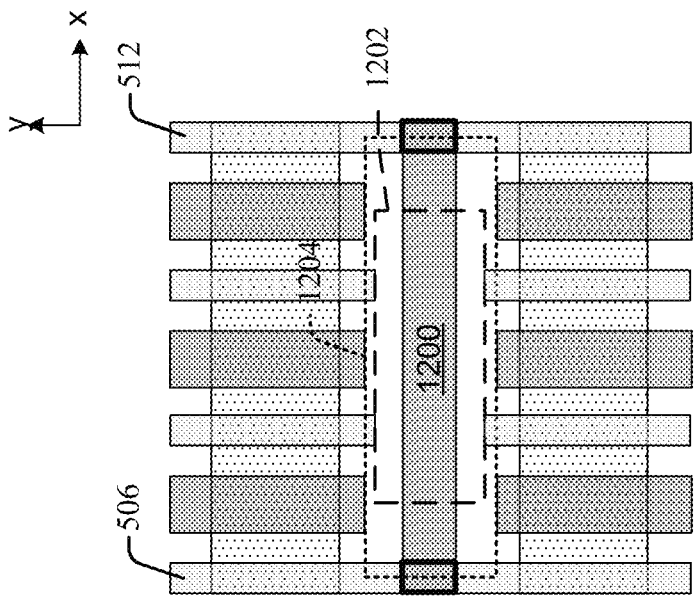
FIG. 13 shows an example of a top layout view wherein a connection operably couples a first P0 line to a second P0 line and after a cut mask have been to set P0 line ends a predetermined distance from nearest edges of connection in accordance with some embodiments.
Figure 12:
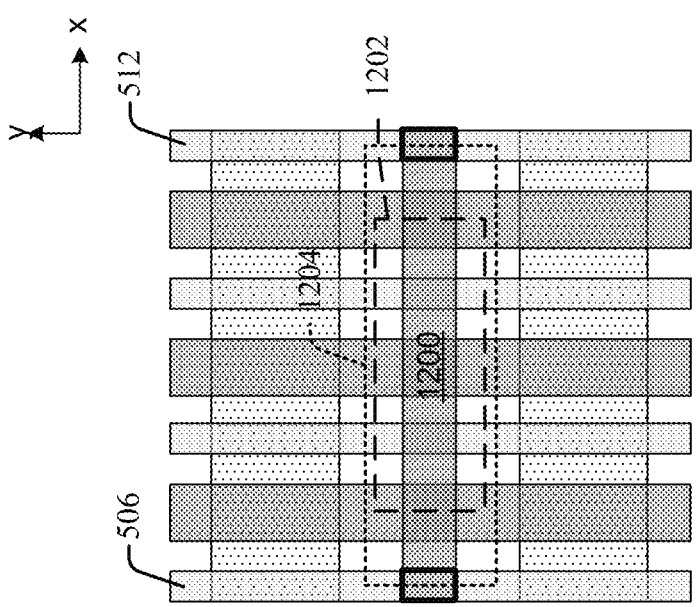
FIG. 12 shows an example of a top layout view wherein a connection operably couples a first P0 line to a second P0 line in accordance with some embodiments.

For example, FIGS. 12-13 show another example where connection 1200 couples a first P0 line 506 to a second P0 line 512. FIG. 12 shows P0 cut mask 1202 having P0 cut shape as well as M0 cut mask 1204 having M0 cut shape, both of which over lap metal lines and poly lines. FIG. 12 shows the structure after being formed, wherein the P0 cut mask 1202 removes or prevents formation of poly lines between poly line ends and connection 1200 and wherein the M0 cut mask 1204 removes or prevents formation of metal lines between metal line ends and connection 1200.

Therefore, some embodiments of the present disclosure relate to a method of designing an integrated circuit layout. In this method, a plurality of poly_zero (P0) lines are provided within a graphical representation of the layout. A plurality of metal_zero (M0) lines are also provided within a graphical representation of the layout, wherein an individual P0 line is interspersed between neighboring M0 lines to define a transistor structure. A poly_zero-to-metal_zero (P0-M0) connection is provided to couple an P0 line to a M0 line. The P0-M0 connection perpendicularly overlaps the P0 lines and the M0 lines. Both a P0 cut mask design layer and an M0 cut mask design layer, which each overlap the P0-M0 connection, are generated. The P0 cut mask design layer is used to cut the P0 line so an end of the cut P0 line is spaced a first predetermined distance from a nearest edge of the P0-M0 connection. The M0 cut mask design layer is used to cut the M0 line so an end of the cut M0 line is spaced a second predetermined distance from the nearest edge of the P0-M0 connection.

Other embodiments of the present disclosure relate to a method of designing an integrated circuit layout. In this method, a first design layer is provided. The first design layer includes first and second active areas within a graphical representation of the layout. The first and second active areas are separated from one another in a first direction by a spacing. A second design layer is then provided which includes a plurality of gate structure lines which extend in the first direction over the first and the second active areas. A third design layer is then provided which includes a plurality of metal lines which extend in the first direction over the first and second active areas. Individual gate structure lines are interspersed between neighboring metal lines. A fourth design layer is provided which includes a connection that extends in a second direction that is perpendicular to the first direction. The connection is arranged in the spacing between the first and second active areas to overlap a portion of a metal line and to overlap a portion of a gate structure line. First and second cut mask design layers, which are symmetrical in the first direction about the connection, are provided. The first cut mask design layer includes a first cut shape configured to cut the gate structure line to set an end of the cut gate structure line at a first predetermined distance from a nearest edge of the connection. The second cut mask design layer includes a second cut shape configured to cut the metal line to set an end of the cut metal line at a second predetermined distance from the nearest edge of the connection.

Still another embodiment relates to a method of designing an integrated circuit layout. In this method, a plurality of design shapes are provided on different design layers over an active area within a graphical representation of the layout. A connection extends perpendicularly between a first design shape formed on a first design layer and a second design shape formed on the first design layer. First and second cut mask shapes on first and second cut mask design layers, respectively, are generated. The first cut shape removes portions of the first design layer and the second cut shape removes portions of the second design layer.

Further, spatially relative terms, such as "over," "on," "beneath," "below," "lower," "above," "upper" and the like, have been used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of designing an integrated circuit (IC) layout, comprising:
   using a computer to provide a plurality of gate_zero (G0) lines within a graphical representation of the layout;
   providing a plurality of metal_zero (M0) lines within a graphical representation of the layout wherein a G0 line is interspersed between neighboring M0 lines to define a transistor structure;
   providing a gate_zero-to-metal_zero (G0-M0) connection to couple the G0 line to a M0 line, wherein the G0-M0 connection perpendicularly overlaps a portion of an intervening G0 line and a portion of an intervening M0 line which are arranged between the G0 line and M0 line; and
   generating both a G0 cut mask design layer and an M0 cut mask design layer that each overlap the G0-M0 connection, wherein the G0 cut mask design layer includes a first cut mask shape which is used to cut the intervening G0 line and remove the portion of the intervening G0 line so an end of the cut G0 line is spaced a first predetermined distance from a nearest edge of the G0-M0 connection, and wherein the M0 cut mask design layer includes a second cut mask shape which is used to cut the intervening M0 line and remove the portion of the intervening M0 line so an end of the cut M0 line is spaced a second predetermined distance from the nearest edge of the G0-M0 connection.

2. The method of claim 1, wherein the first predetermined distance is different from the second predetermined distance.

3. The method of claim 1, wherein the first predetermined distance is smaller than the second predetermined distance.

4. The method of claim 1, wherein the neighboring M0 lines extend in parallel with the G0 line in a first direction, and wherein the M0 cut mask design layer and the G0 cut mask design layer collectively shrink the IC layout in the first direction, compared to if no more than one of the M0 cut mask design layer and G0 cut mask design layer was used to form the integrated circuit.

5. The method of claim 1, wherein the M0 cut mask shape has outer edges that are aligned on centerlines of respective G0 lines, and wherein the G0 cut mask shape has outer edges that are aligned on centerlines of respective M0 lines.

6. The method of claim 1, wherein a width of the G0 cut mask design layer in a first direction is less than a sum of a width of the G0-M0 connection in the first direction plus twice a minimum line end spacing between the G0-M0 connection and a G0 line for a photolithography exposure without a cut mask.

7. The method of claim 1, wherein the G0 cut mask design layer and M0 cut mask design layer collectively shrink the IC layout in a first direction, compared to if no more than one of the G0 cut mask design layer and M0 cut mask design layers was used.

8. The method of claim 1, wherein the G0 lines and M0 lines extend in parallel with one another and in a first direction, and wherein the G0 cut mask design layer and M0 cut mask design layer have different widths as measured in the first direction.

9. The method of claim 8, wherein the G0 cut mask design layer has a first width that is equal to a minimum required design rule spacing between line ends of neighboring G0 lines, and wherein the M0 cut mask design layer has a second width that is equal to a minimum required design rule spacing between line ends of neighboring M0 lines.

10. The method of claim 8, wherein the G0 cut mask design layer and M0 cut mask design layer each have edges that are spaced apart in a second direction, wherein at least one edge of the G0 cut mask design layer is offset from at least one edge of the M0 cut mask design layer in the second direction.

11. The method of claim 1, wherein the plurality of G0 lines are polysilicon lines.

12. The method of claim 1:
wherein the G0 lines are formed on a first design layer, and the M0 lines are formed on a second design layer which is different than the first design layer;
wherein the G0-M0 connection is formed on a third design layer, which is different than the first and second design layers; and
wherein the G0 cut mask design layer or M0 cut mask design layer has edges in the first or second design layer which are parallel to corresponding edges of the G0-M0 connection in the third design layer, wherein the edges of the first or second design layer are laterally spaced apart from the edges of the G0-M0 connection so the first cut mask shape on the G0 cut mask design layer or the second cut mask shape on the M0 cut mask design layer is geometrically similar to the G0-M0 connection.

13. The method of claim 1, wherein the first cut mask shape is used to remove portions of the G0 cut mask design layer that are circumscribed by the first cut mask shape, and wherein the second cut mask shape is used to remove portions of the M0 cut mask design layer that are circumscribed by the second cut mask shape.

14. The method of claim 1, wherein generating the G0 cut mask design layer comprises:
identifying a first centerline of a first design feature, the first centerline extending along a first direction;
identifying a second centerline of a second design feature, the second centerline extending along the first direction;
identifying a third centerline of the G0-M0 connection, the third centerline extending along a second direction which is perpendicular to the first direction; and
wherein the first cut mask shape is a rectangle extending continuously in the second direction between the first and second centerlines and centered in the second direction about the third centerline.

15. The method of claim 1, further comprising:
providing a semiconductor substrate; and
forming the IC layout, which includes the G0 lines, the M0 lines, and the G0-M0 connection, on the semiconductor substrate based on the graphical representation of the layout.

16. A method of designing an integrated circuit (IC) layout, comprising:
using a computer to provide a plurality of gate lines which extend in a first direction and in parallel with one another within a graphical representation of the layout;
providing a plurality of metal_zero lines which extend in the first direction in parallel with the plurality of gate lines within the graphical representation of the layout;
providing a gate-to-metal_zero connection which extends in a second direction that is perpendicular to the first direction to couple a gate line to a metal_zero line, wherein the gate-to-metal_zero connection overlaps a portion of an intervening gate line and a portion of a intervening metal_zero line which are arranged between the gate line and metal_zero line; and
generating both a gate cut mask design layer and a metal_zero cut mask design layer that each overlap the gate-to-metal_zero connection, wherein the gate cut mask design layer includes a first cut mask shape which is used to cut the intervening gate line and remove the portion of the intervening gate line so an end of the cut gate line is spaced a first predetermined distance from a nearest edge of the gate-to-metal_zero connection, and wherein the metal_zero cut mask design layer includes a second cut mask shape which is used to cut the intervening metal_zero line and remove the portion of the intervening metal_zero line so an end of the cut metal_zero line is spaced a second predetermined distance from the nearest edge of the gate-to-metal_zero connection.

17. The method of claim 16:
wherein the gate lines are formed on a first design layer, and the metal_zero lines are formed on a second design layer which is different than the first design layer; and
wherein the gate-to-metal_zero connection is formed on a third design layer, which is different than the first and second design layers.

18. The method of claim 16, wherein generating the gate cut mask design layer comprises:
identifying a first centerline of a first design feature, the first centerline extending along a first direction;
identifying a second centerline of a second design feature, the second centerline extending along the first direction;
identifying a third centerline of the gate-to-metal_zero connection, the third centerline extending along a second direction which is perpendicular to the first direction; and
wherein the first cut mask shape is a rectangle extending continuously in the second direction between the first and second centerlines and centered in the second direction about the third centerline.

19. A method of designing an integrated circuit (IC) layout, comprising:
using a computer to provide a plurality of gate lines which extend in a first direction and in parallel with one another within a graphical representation of the layout;
providing a plurality of metal_zero lines which extend in the first direction in parallel with the plurality of gate lines within the graphical representation of the layout;
providing a gate-to-metal_zero connection which extends in a second direction that is perpendicular to the first direction to couple a gate line to a metal_zero line, wherein the gate-to-metal_zero connection overlaps a portion an intervening gate line and a portion of an intervening metal_zero line which are arranged between the gate line and metal_zero line;
generating both a gate cut mask design layer and a metal_zero cut mask design layer that each overlap the gate-to-metal_zero connection, wherein the gate cut mask design layer includes a first cut mask shape which is used to cut the intervening gate line and remove the portion of the intervening gate line so an end of the cut gate line is spaced a first predetermined distance from a nearest edge of the gate-to-metal_zero connection, and wherein the metal_zero cut mask design layer includes a second cut mask shape which is used to cut the intervening metal_zero line and remove the portion of the intervening metal_zero line so an end of the cut metal_zero line is spaced a second predetermined distance from the nearest edge of the gate-to-metal_zero connection, wherein the first or second cut mask shape is geometrically similar to the gate-to-metal_zero connection;

providing a semiconductor substrate; and forming the IC layout, which includes the gate lines, the metal_zero lines, and the gate-to-metal_zero connection, on the semiconductor substrate based on the graphical representation of the layout.

* * * * *